US006215176B1

(12) United States Patent  
Huang

(10) Patent No.: US 6,215,176 B1  
(45) Date of Patent: Apr. 10, 2001

(54) DUAL LEADFRAME PACKAGE

(75) Inventor: Chih-Kung Huang, Yi-Lang (TW)

(73) Assignee: Sitron Precision Co., Ltd., Hsinchu (TW)

( * ) Notice: Subject to any disclaimer, the term of this patent is extended or adjusted under 35 U.S.C. 154(b) by 0 days.

(21) Appl. No.: 09/313,171

(22) Filed: May 17, 1999

(30) Foreign Application Priority Data

May 4, 1999 (TW) .................................................. 88107215

(51) Int. Cl.[7] .......................... H01L 23/495; H01L 23/48; H01L 23/06
(52) U.S. Cl. .......................... 257/666; 257/675; 257/796; 257/705; 257/712
(58) Field of Search .................................. 257/666, 675, 257/705, 712, 796

(56) References Cited

U.S. PATENT DOCUMENTS

| | | | |
|---|---|---|---|
| 4,984,059 | * | 1/1991 | Kubota et al. ........................ 257/672 |
| 5,606,199 | * | 2/1997 | Yoshigai ............................... 257/666 |
| 5,625,226 | * | 4/1997 | Kinzer .................................. 257/705 |
| 5,637,915 | * | 6/1997 | Sato et al. ............................. 257/666 |
| 5,796,162 | * | 8/1998 | Huang et al. ......................... 257/676 |
| 5,844,310 | * | 12/1998 | Okikawa et al. ..................... 257/712 |
| 6,072,228 | * | 6/2000 | Hinkle et al. ......................... 257/666 |

* cited by examiner

Primary Examiner—Eddie C. Lee  
Assistant Examiner—Jhihan B. Clark  
(74) Attorney, Agent, or Firm—Jiawei Huang; J.C. Patents

(57) ABSTRACT

A dual leadframe package. A chip including a first surface and a second surface is provided. A gate and a first source/drain region are located on the first surface, and a second source/drain region is located on the second surface. A first lead including a first innerlead and a first outerlead and a second lead including a second innerlead and a second outerlead are provided. The first innerlead is coupled to the first source/drain region, and the second innerlead is coupled to the gate. A conductive plate including a top surface and a bottom surface is provided, and the top surface is coupled to the second source/drain region. A packaging material seals the chip, the first innerlead, the outerlead and a portion of the conductive plate. The bottom surface, the first outerlead and the second outerlead are exposed.

17 Claims, 4 Drawing Sheets

DUAL LEADFRAME PACKAGE

CROSS-REFERENCE TO RELATED APPLICATION

This application claims the priority benefit of Taiwan application serial no. 88107215, filed May 4, 1999, the full disclosure of which is incorporated herein by reference.

BACKGROUND OF THE INVENTION

1. Field of the Invention

The present invention relates to a semiconductor package. More particularly, the present invention relates to a dual leadframe package.

2. Description of the Related Art

As chip integration increases, various semiconductor packages are used, such as a chip scale package or a multi-chip module, for example. However, a leadframe is usually used for packaging a low pin count chip such as a high-voltage device.

FIG. 1 is a schematic, cross-sectional view of a conventional low pin count semiconductor package.

Referring to FIG. 1, a chip 12 is attached to a bonding pad 10 and coupled to a lead 18 through a wire 14 formed by wire bonding. The chip 12, the wire 14, the bonding pad 10 and a portion of the lead 18 are sealed by a packaging material 16. The packaging material 16 fixes the relative position of the chip 12, the bonding pad 10, the wire 14 and the lead 18 and protects the chip 12. A portion of the lead 18 exposed is bent downward for coupling to a printed circuit board. Additionally, the lead 18 can be formed in a gull wing shape to couple to the printed circuit board through a surface mount technique.

In the conventional packaging process, many steps are needed and many kinds of machines are needed to perform the steps. Furthermore, it is time-consuming to perform the wire bonding process. The manufacturing time and the manufacturing cost are high. It is difficult to increase throughput.

The signal transmitting path including the lead and the wire is long, so that impedance may increase, and signal decay and signal delay may occur. The package structure properties do not satisfy the requirement of the chip. For example, in 0.4 $\mu$m MOS, the resistance of the chip is 0.2 m$\Omega$-cm. However, the resistance of the chip scale package is 20 m$\Omega$-cm, so that the performance of the chip is seriously affected. Moreover, the volume of the package is large. The large volume restricts the application of the chip.

SUMMARY OF THE INVENTION

Accordingly, the present invention provides a dual leadframe package, for which package the volume is small and the signal transmitting path is short.

To achieve these and other advantages and in accordance with the purpose of the invention, as embodied and broadly described herein, the invention provides a dual leadframe package. A chip including a first surface and a second surface is provided. A gate and a first source/drain region are located on the first surface, and a second source/drain region is located on the second surface. A first lead including a first innerlead and a first outerlead and a second lead including a second innerlead and a second outerlead are provided. The first innerlead is coupled to the first source/drain region, and the second innerlead is coupled to the gate. A conductive plate including a top surface and a bottom surface is provided, and the top surface is coupled to the second source/drain region. A packaging material seals the chip, the first innerlead, the outerlead and a portion of the conductive plate. The bottom surface, the first outerlead and the second outerlead are exposed.

To achieve these and other advantages and in accordance with the purpose of the invention, as embodied and broadly described herein, the invention provides a method for fabricating a dual leadframe package. The method includes the following steps. A chip having a first surface and a second surface is provided. A gate and a first source/drain region are located on the first surface, and a second source/drain region is located on the second surface. A first leadframe including a dam bar, a first lead and a second lead, and a second leadframe including a conductive plate are provided. The first lead and the second lead are fixed on the first leadframe through the dam bar. The conductive plate is supported by the supporting bar. The first leadframe is placed on the first surface, the first lead is coupled to the first source/drain region and the second lead is coupled to the gate. The second leadframe is placed on the second surface and the conductive plate is coupled to second source/drain region. The chip, the first lead, the second lead and a portion of the conductive plate are sealed by a packaging material.

In the invention, the lead and the conductive plate are directly coupled to the chip, so the signal transmitting path is obviously reduced and the resistance of the package is also reduced. Furthermore, the conductive plate serves as a heat slug to help dissipate heat generated by operating the chip.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
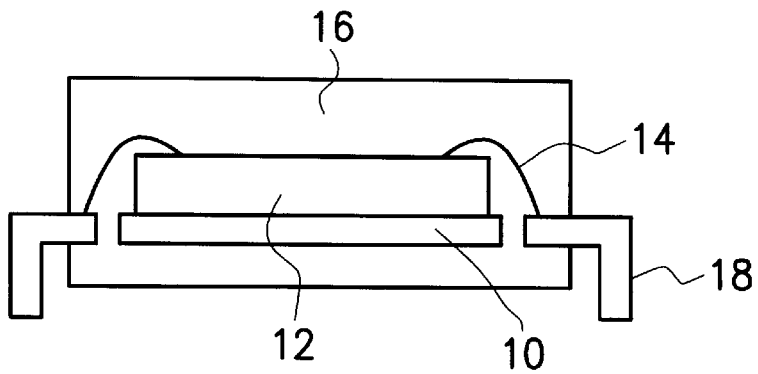
FIG. 1 is a schematic, cross-sectional view of a conventional low pin count semiconductor package.

Reference will now be made in detail to the present preferred embodiments of the invention, examples of which are illustrated in the accompanying drawings. Wherever possible, the same reference numbers are used in the drawings and the description to refer to the same or like parts.

In the embodiment, a high-voltage device including only a few contacts is described. The invention is not restricted by this embodiment. Other kinds of devices are also suitable for the invention.

Figure 2:
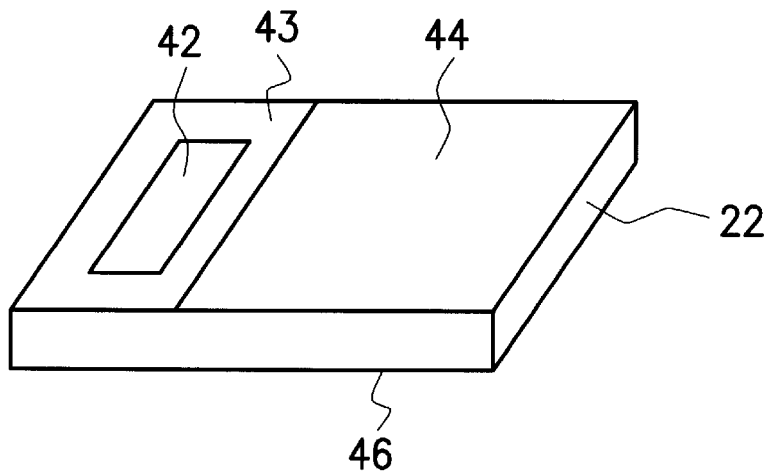
FIG. 2 is a schematic, perspective view of a high-voltage device used in the invention.

FIG. 2 is a schematic, perspective view of a high-voltage device used in the invention.

Referring to FIG. 2, a chip 22 includes a source region 44, an insulation material 43 surrounding the source region 44, a gate 42 on a side, and a drain region 46 on the other side opposite the source region 44.

Figure 3:
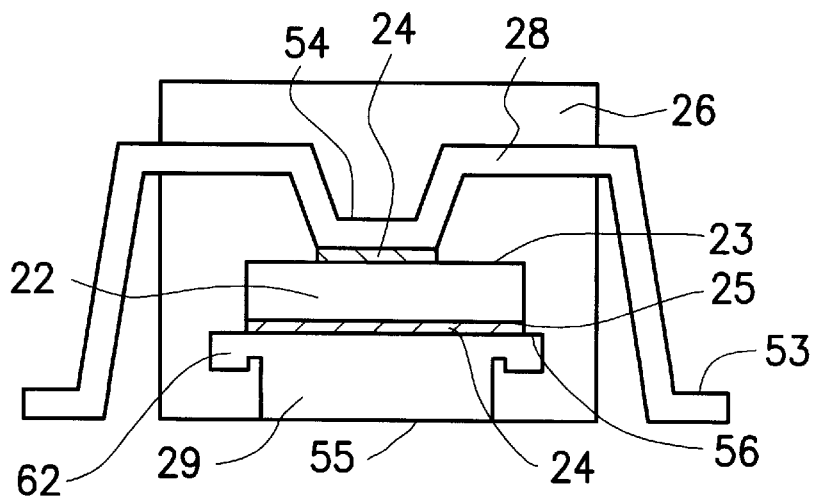
FIG. 3 is a schematic, cross-sectional view of a dual leadframe package according to the invention.

FIG. 3 is a schematic, cross-sectional view of a dual leadframe package according to the invention.

Referring to FIG. 3, a chip 22 is the same as the one shown in FIG. 2. An innerlead 54 of a lead 28 is coupled with a surface 23 of the chip 22 by a conductive material 24. A surface 56 of a conductive plate 29 is also coupled with a surface 25 of the chip 22 by the conductive material 24. The conductive material 24 is preferably silver paste. A packaging material 26 seals the chip 22, the innerlead 54 and a portion of the conductive plate 29. However, an outerlead 53 of the lead 28 and a surface 55 of the conductive plate 29 are exposed. As a result, the lead 28 and the conductive plate 29 can be coupled with a printed circuit board.

In the invention, the conductive plate 29 has a function of transmitting signals. Additionally, the conductive plate 29 serves as a heat slug. The conductive plate 29 helps to dissipate heat generated by operating the chip 22.

In the embodiment, a high-voltage device is described. However, the invention is not restricted. Other kinds of device having low pin counts are also suitable for the invention.

Figure 4:
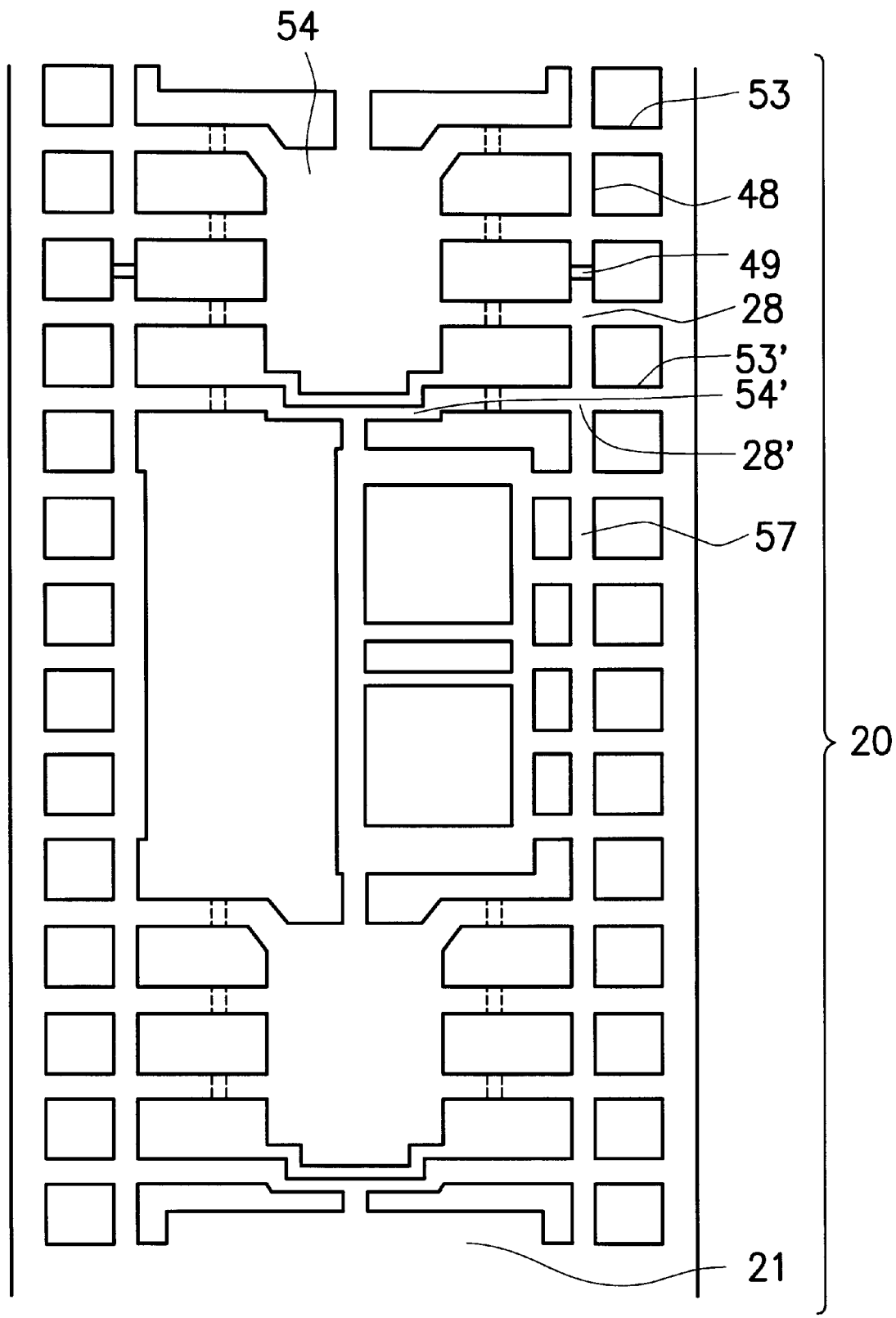
FIG. 4 is a schematic, top view of a leadframe according to the invention.
Figure 5:
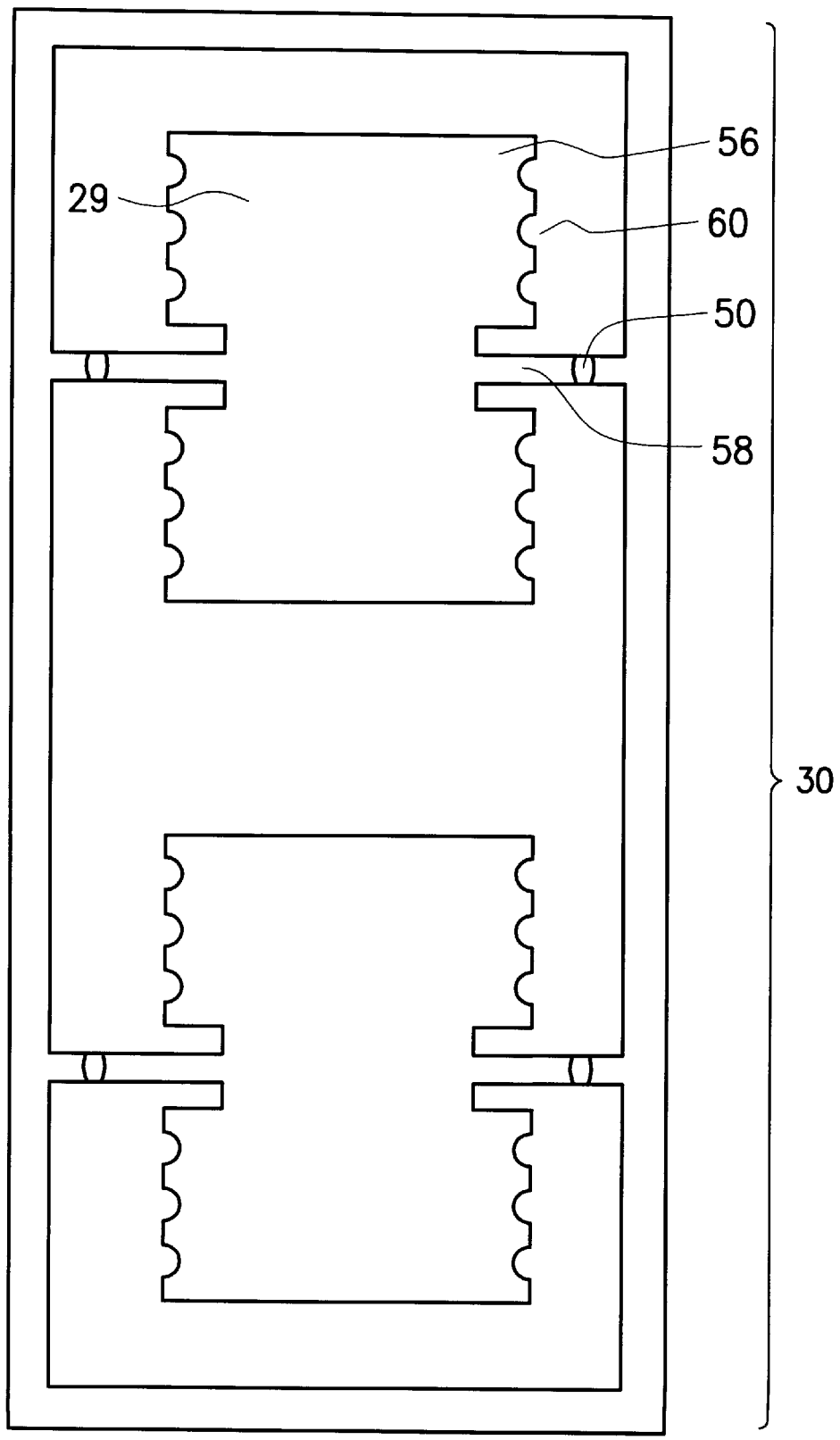
FIG. 5 is a schematic, top view of another leadframe according to the invention.
Figure 6:
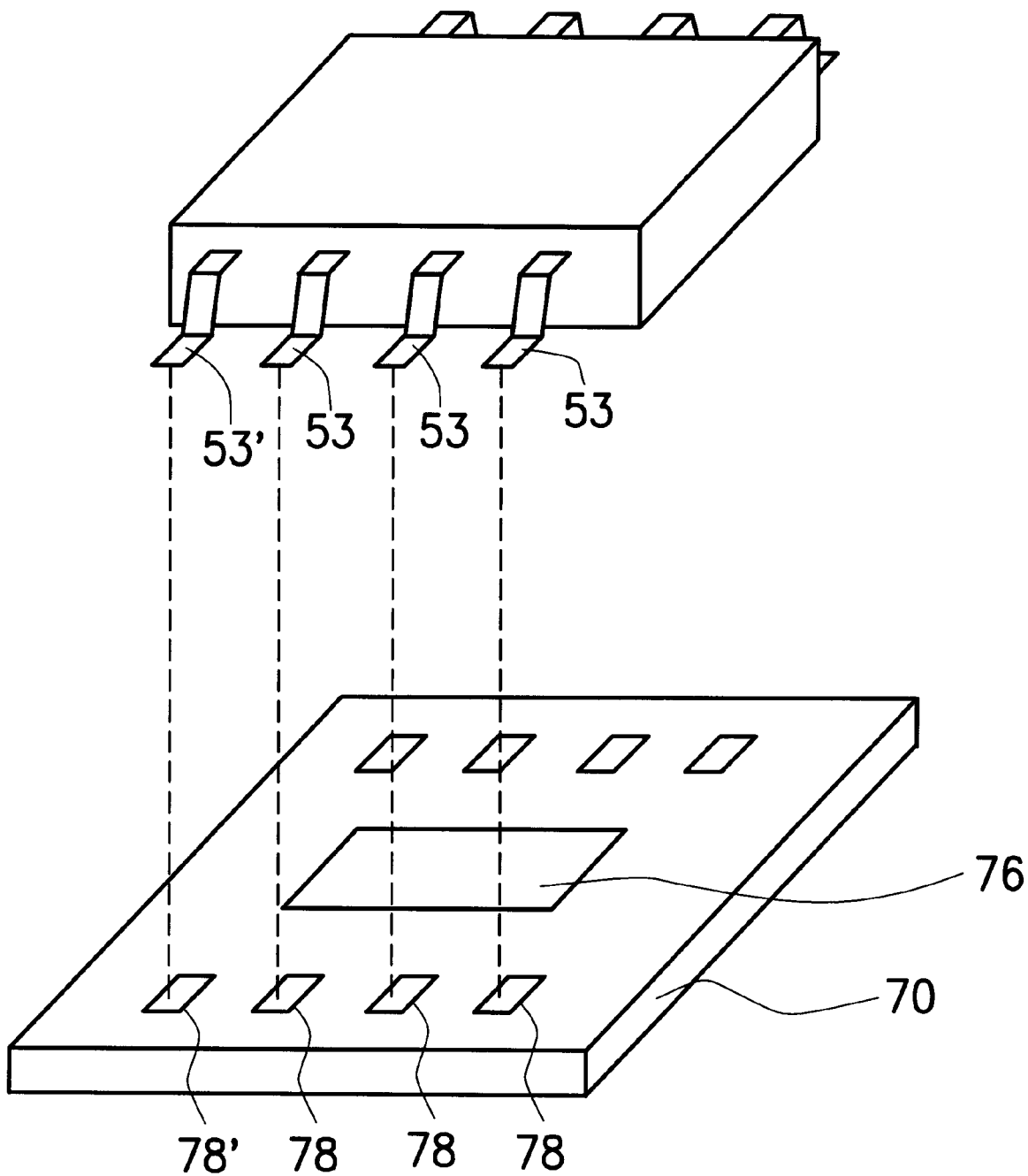
FIG. 6 is a schematic, exploded view of a dual leadframe package according to the invention and a printed circuit board.

FIG. 4 is a schematic, top view of a leadframe according to the invention. FIG. 5 is a schematic, top view of another leadframe according to the invention. FIG. 6 is a schematic, exploded view of a dual leadframe package according to the invention and a printed circuit board.

Referring to FIGS. 2, 3, 4, 5 and 6, a leadframe 20 is punched, so that the innerlead 54 of the lead 28 and an innerlead 54' of a lead 28' are bent. The innerleads 54, 54' are respectively coupled to the source region 44 and the gate 42 by a conductive material such as silver paste, for example. Similarly, the surface 56 of the conductive plate 29 is also coupled to the drain region 46 by the conductive material.

The leads 28, 28' are directly connected to a side rail 21 of the leadframe 20, and the lead 28 is connected to the leads 28' by a dam bar 57 which prevents the packaging material 26 from bleeding. Two sides of the conductive plate 29 are connected to the leadframe 30 by supporting bars 58. The supporting bars 58 fix the conductive plate 29 before a packaging process. While connecting the chip 22 to the conductive plate 29, the supporting bars 58 are also bent upward to fix the chip 22. In FIG. 5, several concave regions 60 whose shapes are, for example, semicircular, are formed in two sides of the conductive plate 29 in the invention. The concave regions 60 can dissipate stress generated by curing the packaging material 26. As a result, a supporting strength of the packaging material 26 to the leadframe 30 is stronger due to the erose edge structure of the conductive plate 29 as shown in FIG. 5. As a result, a supporting strength of the packaging material 26 to the leadframe 30 is stronger.

Then, the chip 22 and the leadframes 20, 30 are placed in a mold. The packaging material 26 is injected into the mold to seal the chip 22, the innerleads 28, 28' and a portion of the conductive plate 29. Moreover, the outerlead 53, 53' and the surface 55 of the conductive plate 29 are exposed. After curing the packaging material 26, the dam bar 57 and the supporting bar 58 are cut, and the outerleads 53, 53' are bent like gull wings. The outerleads 53, 53' and the surface 55 of the conductive plate 29 are respectively coupled to contacts 78, 78' and 76 on a printed circuit board 70. The outerleads 53, 53' and the surface 55 of the conductive plate 29 are respectively coupled to contacts 76 and 78 on a printed circuit board 70.

An edge 62 of the conductive plate 29 is, for example, like a ladder structure, so that an area of the surface 56 is larger than the surface 55. Since the area of the surface 56 is larger than the surface 55, a strength pushing the conductive plate 29 to the mold is stronger than a strength pulling the conductive plate 29 away the mold while injecting the packaging material 26 into the mold. As a result, the conductive plate 29 is closely placed on the bottom of the mold, and the packaging material 26 does not bleed onto the surface 55. There is no need for an extra step to remove residual packaging material 26 on the surface 55 of the conductive plate 29.

In general, the mold clamps the dam bar 57 during the packaging process. However, the overlapped portion is twice thicker than other portion of the leadframe 20 or the leadframe 30 when the supporting bar 58 overlaps the dam bar 57. To avoid fabricating a new mold, concave regions 49, 50 are respectively formed in each overlapped portion of the dam bar 57 and the supporting bar 58. Therefore, the thickness of the overlapped portion is the same as the other portions of the leadframe 20 or the leadframe 30. There is no need to fabricate a new mold. The package according to the invention is compatible with the conventional mold.

The signal transmitting path in the invention is short because the conductive plate 29 can transmit signals. Therefore, impedance decreases, and signal decay and signal delay do not occur. Additionally, the conductive plate 29 serves as a heat slug to help dissipate heat generated by operating the chip 22.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual leadframe package, the structure comprising:
   a chip having a first surface and a second surface, wherein a gate and a first source/drain region are on the first surface, and a second source/drain region is on the second surface;
   a first lead having a first innerlead and a first outer lead, wherein the first source/drain region is coupled to the first lead;
   a second lead having a second innerlead and a second outerlead, wherein the gate is coupled with the second lead;
   a conductive plate having a top surface, a bottom surface smaller than the top surface and two erose edges, wherein the second source/drain region is coupled with the top surface; and
   a packaging material sealing the chip, the first innerlead, the second innerlead and the conductive plate, wherein the first outerlead, the second outer lead and the bottom surface are exposed, and the erose edges of the conductive plate dissipate stress generated by curing the packaging material 26 for the sealing step.

2. The structure of claim 1, wherein the first lead, the second lead and the top surface are respectively coupled with the first source/drain region, the gate and the second source/drain region by a conductive material.

3. The structure of claim 1, wherein an area of the top surface is larger than an area of the bottom surface.

4. The structure of claim 1, wherein the erose edges of the conductive plate include a plurality of semicircular concave regions.

5. The structure of claim 1, wherein the first outerlead and the second outerlead protrude from a side of the dual leadframe package, and the bottom surface is at the bottom of the dual leadframe package.

6. The structure of claim 2, wherein the conductive material includes silver paste.

7. A dual leadframe package on a printed circuit board, wherein a first contact, a second contact and a third contact are located on the printed circuit board, the dual leadframe package comprising:

a chip having a first surface and a second surface, wherein a gate and a first source/drain region are on the first surface, and a second source/drain region is on the second surface;

a first lead having a first innerlead and a first outerlead, wherein the first source/drain region is coupled with the first lead;

a second lead having a second innerlead and a second outerlead, wherein the gate is coupled with the second lead;

a conductive plate having a top surface, a bottom surface and two erose edges, wherein the second source/drain region is coupled with the top surface; and a packaging material sealing the chip, the first innerlead, the second innerlead and the conductive plate, wherein the first outerlead, the second outerlead and the bottom surface are coupled with the first contact, the second contact and the third contact, respectively, and the bottom surface are directly in contact with the third contact to shorten a signal transmitting path for the chip and to provide an direct path for heat dissipation.

8. The dual leadframe package of claim 7, wherein the first lead, the second lead and the top surface are respectively coupled with the first source/drain region, the gate and the second source/drain region by a conductive material.

9. The dual leadframe package of claim 7, wherein an area of the top surface is larger than an area of the bottom surface.

10. The dual leadframe package of claim 7, wherein sidewalls of the conductive plate include a plurality of semicircular concave regions.

11. The dual leadframe package of claim 7, wherein the first outerlead and the second outerlead protrude from a side of the dual leadframe package and are respectively coupled to the first contact and the second contact on the printed circuit board, and the bottom surface is at the bottom of the dual leadframe package and is coupled to the third contact on the printed circuit board.

12. The dual leadframe package of claim 8, wherein the conductive material includes silver paste.

13. A dual leadframe package, comprising:

a chip having a first surface and a second surface, wherein at least a first contact is on the first surface, and at least a second contact is on the second surface;

a lead having an innerlead and an outerlead on the first surface, wherein the innerlead is coupled with the first contact;

a conductive plate having a top surface and a bottom surface on the second surface, wherein the second contact is coupled with the top surface; and a packaging material sealing the chip, the innerlead and a portion of the conductive plate, wherein the outerlead and the bottom surface are exposed.

14. A dual leadframe package, comprising:

a first leadframe, further comprising:
a side rail;
a plurality of leads, wherein each of the leads further comprises an innerlead and an outerlead; and
at least a dam bar, to connect to the side rail with the leads;

a second leadframe, further comprising:
a conductive plate wherein the conductive plate comprises two erose edges such that a stress generated while curing the package material is released; and
a supporting bar, to fix the conductive plate to the second leadframe;

a chip, to be packaged between the first and the second leadframes; and a packaging material, sealing the chip between the first and the second leadframes, the innerleads and one side of the conductive plate therein.

15. The dual leadframe package of claim 14, wherein the supporting bar further comprises a supporting bar bent towards a surface on which the chip is fixed.

16. The dual leadframe package of claim 14, wherein the dam bar further comprises a concave region at which the supporting bar is overlapped after packaging the chip between the first and the second leadframes.

17. The dual leadframe package of claim 14, wherein the supporting bar further comprises a concave region at which the dam bar is overlapped after packaging the chip between the first and the second leadframes.

* * * * *